US012366606B2

United States Patent
Han et al.

(10) Patent No.: US 12,366,606 B2
(45) Date of Patent: Jul. 22, 2025

(54) SELF-FUNCTIONAL DETECTION SYSTEM FOR TAP CONTROLLER AND METHOD THEREOF

(71) Applicants: SQ Technology (Shanghai) Corporation, Shanghai (CN); Inventec Corporation, Taipei (TW)

(72) Inventors: Xue-Shan Han, Shanghai (CN); Xiao-Xiao Mao, Shanghai (CN); Jin-Dong Zhao, Shanghai (CN)

(73) Assignees: SQ Technology (Shanghai) Corporation, Shanghai (CN); Inventec Corporation, Taipei (TW)

( * ) Notice: Subject to any disclaimer, the term of this patent is extended or adjusted under 35 U.S.C. 154(b) by 28 days.

(21) Appl. No.: 18/592,287

(22) Filed: Feb. 29, 2024

(65) Prior Publication Data
US 2025/0189582 A1 Jun. 12, 2025

(30) Foreign Application Priority Data
Dec. 7, 2023 (CN) .......................... 202311676779.4

(51) Int. Cl.
*G01R 31/3185* (2006.01)
*G01R 31/317* (2006.01)

(52) U.S. Cl.
CPC .......... *G01R 31/318597* (2013.01); *G01R 31/31724* (2013.01)

(58) Field of Classification Search
None
See application file for complete search history.

(56) References Cited

U.S. PATENT DOCUMENTS

| | | | | |
|---|---|---|---|---|
| 6,757,844 B1 * | 6/2004 | Lulla | ............... | G01R 31/318555 714/724 |
| 8,037,355 B2 * | 10/2011 | Swoboda | .................. | G06F 1/12 710/110 |
| 9,817,066 B1 * | 11/2017 | Kuramoto | ...... | G01R 31/318594 |
| 11,243,252 B1 * | 2/2022 | Seetharaman | ..... | G01R 31/3177 |
| 11,927,632 B1 * | 3/2024 | Mu | ................ | G01R 31/318533 |
| 12,188,984 B1 * | 1/2025 | Cai | ................ | G01R 31/318555 |

(Continued)

OTHER PUBLICATIONS

X. Chen, D. Zhang and H. Yang, "Design and Implementation of a Single-Chip ARM-Based USB Interface JTAG Emulator," 2008 Fifth IEEE International Symposium on Embedded Computing, Beijing, China, 2008, pp. 272-275, (Year: 2008).*

*Primary Examiner* — Daniel F. McMahon

(57) ABSTRACT

A self-functional detection system for TAP controller and a method thereof are disclosed. In the system, a TAP controller includes a DCM circuit, and a data device can obtain and display a voltage signal, a GPIO signal and a high-speed signal from the DCM circuit through an API, to implement detection for an internal circuit of the TAP controller. Alternatively, the TAP controller is electrically connected to the external function detection module device, the data device obtains the JTAG signal from the DCM circuit through an API and displays the JTAG signal, so as to detect whether the communication port function of the TAP controller works normally, and further detect whether an external connection of the TAP controller works normally. Therefore, the technical effect of providing self-functional detection of a TAP controller to determine occur point of test error accurately may be achieved.

8 Claims, 7 Drawing Sheets

(56) References Cited

U.S. PATENT DOCUMENTS

| | | | |
|---|---|---|---|
| 2005/0073788 A1* | 4/2005 | Weinraub | G01R 31/318552 361/100 |
| 2005/0210345 A1* | 9/2005 | Bybell | G01R 31/318555 714/724 |
| 2007/0061646 A1* | 3/2007 | Whetsel | G01R 31/31725 714/726 |
| 2010/0058130 A1* | 3/2010 | Somasundaram | G01R 31/318533 714/E11.169 |
| 2014/0181605 A1* | 6/2014 | Lingannagari | G01R 31/318555 714/727 |
| 2017/0184668 A1* | 6/2017 | Song | G06F 11/273 |

\* cited by examiner

```
┌─────────────────────────────────────────────┐
│ Providing a TAP controller, wherein the TAP │
│ controller comprises an uplink circuit, a   │ ─ 401
│ data transmission hub circuit, a TAP power  │
│ module, a protocol conversion and data      │
│ buffer circuit, a power output circuit, a   │
│ TAP data bus circuit, a TAP IO buffer       │
│ circuit, a TAP JTAG driver circuit, a       │
│ discontinuous conduction mode circuit and   │
│ the at least one communication port         │
└─────────────────────────────────────────────┘
                      │
                      ▼
┌─────────────────────────────────────────────┐
│ Electrically connecting the data            │ ─ 402
│ transmission hub circuit to the uplink      │
│ circuit                                     │
└─────────────────────────────────────────────┘
                      │
                      ▼
┌─────────────────────────────────────────────┐
│ Electrically connecting the TAP power       │ ─ 403
│ module to the uplink circuit                │
└─────────────────────────────────────────────┘
                      │
                      ▼
┌─────────────────────────────────────────────┐
│ Electrically connecting the protocol        │ ─ 404
│ conversion and data buffer circuit to the   │
│ data transmission hub circuit               │
└─────────────────────────────────────────────┘
                      │
                      ▼
┌─────────────────────────────────────────────┐
│ Electrically connecting the power output    │ ─ 405
│ circuit to the protocol conversion and      │
│ data buffer circuit                         │
└─────────────────────────────────────────────┘
                      │
                      ▼
┌─────────────────────────────────────────────┐
│ Electrically connecting the TAP data bus    │ ─ 406
│ circuit to the protocol conversion and      │
│ data buffer circuit                         │
└─────────────────────────────────────────────┘
                                     │
                                     ▼
                                   ( A )
```

FIG. 4A

SELF-FUNCTIONAL DETECTION SYSTEM
FOR TAP CONTROLLER AND METHOD
THEREOF

BACKGROUND OF THE INVENTION

1. Field of the Invention

The present invention is related to a self-functional detection system and a method thereof, and more particularly to a self-functional detection system for TAP controller and a method thereof.

2. Description of the Related Art

The existing JTAG (Joint Test Action Group) testing utilizes a test access port (TAP) controller for relevant tests, and a TAP controller is integrated into the overall testing system, to form a complete testing system in conjunction with the testing machine.

In practical application, when a testing error occurs, if it manifests as a data transmission type error, integrating the TAP controller into the JTAG testing system makes it challenging to directly determine whether the error occurred in the TAP controller or in other units of the testing system. This results in the inability to accurately determine the problem area where the testing error occurred in JTAG testing.

According to above-mentioned contents, what is needed is to develop an improved solution to solve the conventional problem that integrating the TAP controller into the JTAG testing system make it challenging to accurately determine the problem area where the testing error occurred in JTAG testing.

SUMMARY OF THE INVENTION

An objective of the present invention is to disclose a self-functional detection system for TAP controller and a method thereof, to solve the conventional problem that integrating a TAP controller into a JTAG testing system make it challenging to accurately determine the problem area where the testing error occurred in JTAG testing.

In order to achieve the objective, the present invention provides a self-functional detection system for TAP controller, and the self-functional detection system includes a TAP controller, an external function detection module device and a data device. The TAP controller includes an uplink circuit, a data transmission hub circuit, a TAP power module, a protocol conversion and data buffer circuit, a power output circuit, a TAP data bus circuit, a TAP IO buffer circuit, a TAP JTAG driver circuit, a discontinuous conduction mode circuit and at least one communication port. The external function detection module device includes at least one external communication port, a switch circuit, an external power supply module, an external data bus circuit, an ADC and IO buffer circuit, a JTAG signal circuit, a level shift circuit, and a complex programmable logic device.

The data transmission hub circuit is electrically connected to the uplink circuit. The TAP power module is electrically connected to the uplink circuit. The protocol conversion and data buffer circuit is electrically connected to the data transmission hub circuit. The power output circuit is electrically connected to the protocol conversion and data buffer circuit. The TAP data bus circuit is electrically connected to the protocol conversion and data buffer circuit. The TAP IO buffer circuit is electrically connected to the protocol conversion and data buffer circuit. The TAP JTAG driver circuit is electrically connected to the protocol conversion and data buffer circuit. The discontinuous conduction mode circuit is electrically connected to the data transmission hub circuit, the power output circuit, the data bus circuit, the IO buffer circuit and the JTAG driver circuit, and configured to obtain a voltage signal, a GPIO signal and a high-speed (HS) signal from the power output circuit, the data bus circuit, the IO buffer circuit and the JTAG driver circuit, or obtain a JTAG signal from the JTAG driver circuit. The at least one communication port is electrically connected to the power output circuit, the data bus circuit, the IO buffer circuit, and the JTAG driver circuit.

The at least one external communication port is electrically connected to one of the at least one communication port. The switch circuit is electrically connected to the external communication port, and configured to select the at least one communication port electrically connected to the at least one external communication port. The external power supply module is electrically connected to the switch circuit. The external data bus circuit, electrically connected to the external communication port. The ADC and IO buffer circuit is electrically connected to the external communication port. The JTAG signal circuit is electrically connected to the external communication port. The level shift circuit is electrically connected to the JTAG signal circuit. The complex programmable logic device is electrically connected to the external data bus circuit, the ADC and IO buffer circuit, and the level shift circuit. The data device is electrically connected to the TAP controller, and configured to obtain the voltage signal, the GPIO signal and the high-speed signal from the DCM circuit through an application programming interface (API) and display the voltage signal, the GPIO signal and the high-speed signal, or obtain the JTAG signal from the DCM circuit and display the JTAG signal, through the API.

In order to achieve the objective, the present invention provides a self-functional detection method for TAP controller. The self-functional detection method includes steps of: providing a TAP controller, wherein the TAP controller comprises an uplink circuit, a data transmission hub circuit, a TAP power module, a protocol conversion and data buffer circuit, a power output circuit, a TAP data bus circuit, a TAP IO buffer circuit, a TAP JTAG driver circuit, a discontinuous conduction mode circuit and the at least one communication port; electrically connecting the data transmission hub circuit to the uplink circuit; electrically connecting the TAP power module to the uplink circuit; electrically connecting the protocol conversion and data buffer circuit to the data transmission hub circuit; electrically connecting the power output circuit to the protocol conversion and data buffer circuit; electrically connecting the TAP data bus circuit to the protocol conversion and data buffer circuit; electrically connecting the TAP IO buffer circuit to the protocol conversion and data buffer circuit; electrically connecting the TAP JTAG driver circuit to the protocol conversion and data buffer circuit; electrically connecting the discontinuous conduction mode circuit to the data transmission hub circuit, the power output circuit, the data bus circuit, the IO buffer circuit and the JTAG driver circuit; obtaining a voltage signal, a GPIO signal and a high-speed signal from the power output circuit, the data bus circuit, the IO buffer circuit and the JTAG driver circuit, or obtaining a JTAG signal from the JTAG driver circuit, by the discontinuous conduction mode circuit; electrically connecting at least one communication port to the power output circuit, the data bus circuit, the IO buffer circuit and the JTAG driver circuit;

providing an external function detection module device, wherein the external function detection module device includes at least one external communication port, a switch circuit, an external power supply module, an external data bus circuit, an ADC and IO buffer circuit, a JTAG signal circuit, a level shift circuit and a complex programmable logic device (CPLD); electrically connecting the at least one external communication port to the at least one communication port; electrically connecting the switch circuit to the external communication port, and selecting the at least one communication port electrically connected to the at least one external communication port, by the switch circuit; electrically connecting the external power supply module to the switch circuit; electrically connecting the external data bus circuit to the external communication port; electrically connecting the ADC and IO buffer circuit to the external communication port; electrically connecting the JTAG signal circuit to the external communication port; electrically connecting the level shift circuit to the JTAG signal circuit; electrically connecting a CPLD to the external data bus circuit, the ADC and IO buffer circuit and the level shift circuit; electrically connecting the data device to the TAP controller, and obtaining the voltage signal, the GPIO signal and the high-speed signal from the DCM circuit through an API and displaying the voltage signal, the GPIO signal and the high-speed signal, or obtaining the JTAG signal from the DCM circuit through the API and displaying the JTAG signal, by the data device.

According to the above-mentioned system and method of the present invention, the TAP controller includes the DCM circuit, and the data device can obtain and display the voltage signal, the GPIO signal and the high-speed signal from the DCM circuit through the API, to implement detection for the internal circuit of the TAP controller; alternatively, the TAP controller can be electrically connected to the external function detection module device, the data device obtains the JTAG signal from the DCM circuit through the API and displays the JTAG signal, so as to detect whether the communication port function of the TAP controller works normally, and further detect whether an external connection of the TAP controller works normally.

Therefore, the above-mentioned solution of the present is able to achieve the technical effect of providing self-functional detection of a TAP controller to determine occur point of test error accurately.

BRIEF DESCRIPTION OF THE DRAWINGS

The structure, operating principle and effects of the present invention will be described in detail by way of various embodiments which are illustrated in the accompanying drawings.

FIG. 4A to FIG. 4D are flowcharts of a self-functional detection method for TAP controller, according to the present invention.

DETAILED DESCRIPTION OF THE PREFERRED EMBODIMENTS

Figure 1:
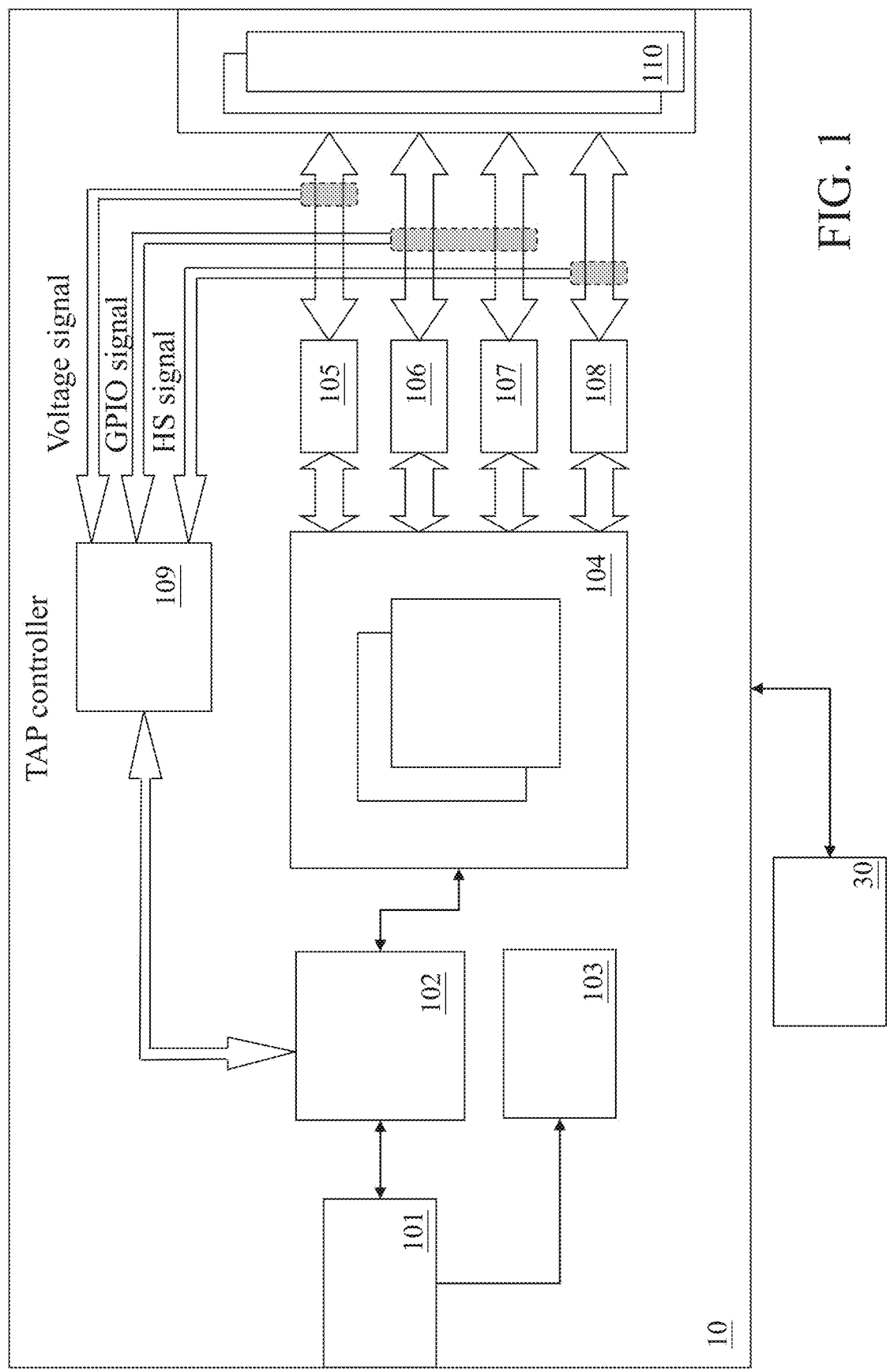
FIG. 1 is a block diagram of a TAP controller of a self-functional detection system, according to the present invention.

The following embodiments of the present invention are herein described in detail with reference to the accompanying drawings. These drawings show specific examples of the embodiments of the present invention. These embodiments are provided so that this disclosure will be thorough and complete, and will fully convey the scope of the invention to those skilled in the art. It is to be acknowledged that these embodiments are exemplary implementations and are not to be construed as limiting the scope of the present invention in any way. Further modifications to the disclosed embodiments, as well as other embodiments, are also included within the scope of the appended claims.

These embodiments are provided so that this disclosure is thorough and complete, and fully conveys the inventive concept to those skilled in the art. Regarding the drawings, the relative proportions, and ratios of elements in the drawings may be exaggerated or diminished in size for the sake of clarity and convenience. Such arbitrary proportions are only illustrative and not limiting in any way. The same reference numbers are used in the drawings and description to refer to the same or like parts. As used herein, the singular forms "a", "an" and "the" are intended to include the plural forms as well, unless the context clearly indicates otherwise.

It is to be acknowledged that, although the terms 'first,' 'second,' 'third,' and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

It will be acknowledged that when an element or layer is referred to as being "on," "connected to" or "coupled to" another element or layer, it can be directly on, connected or coupled to the other element or layer, or intervening elements or layers may be present. In contrast, when an element is referred to as being "directly on," "directly connected to" or "directly coupled to" another element or layer, there are no intervening elements or layers present.

In addition, unless explicitly described to the contrary, the words "comprise" and "include," and variations such as "comprises," "comprising," "includes," or "including," will be acknowledged to imply the inclusion of stated elements but not the exclusion of any other elements.

Figure 2:
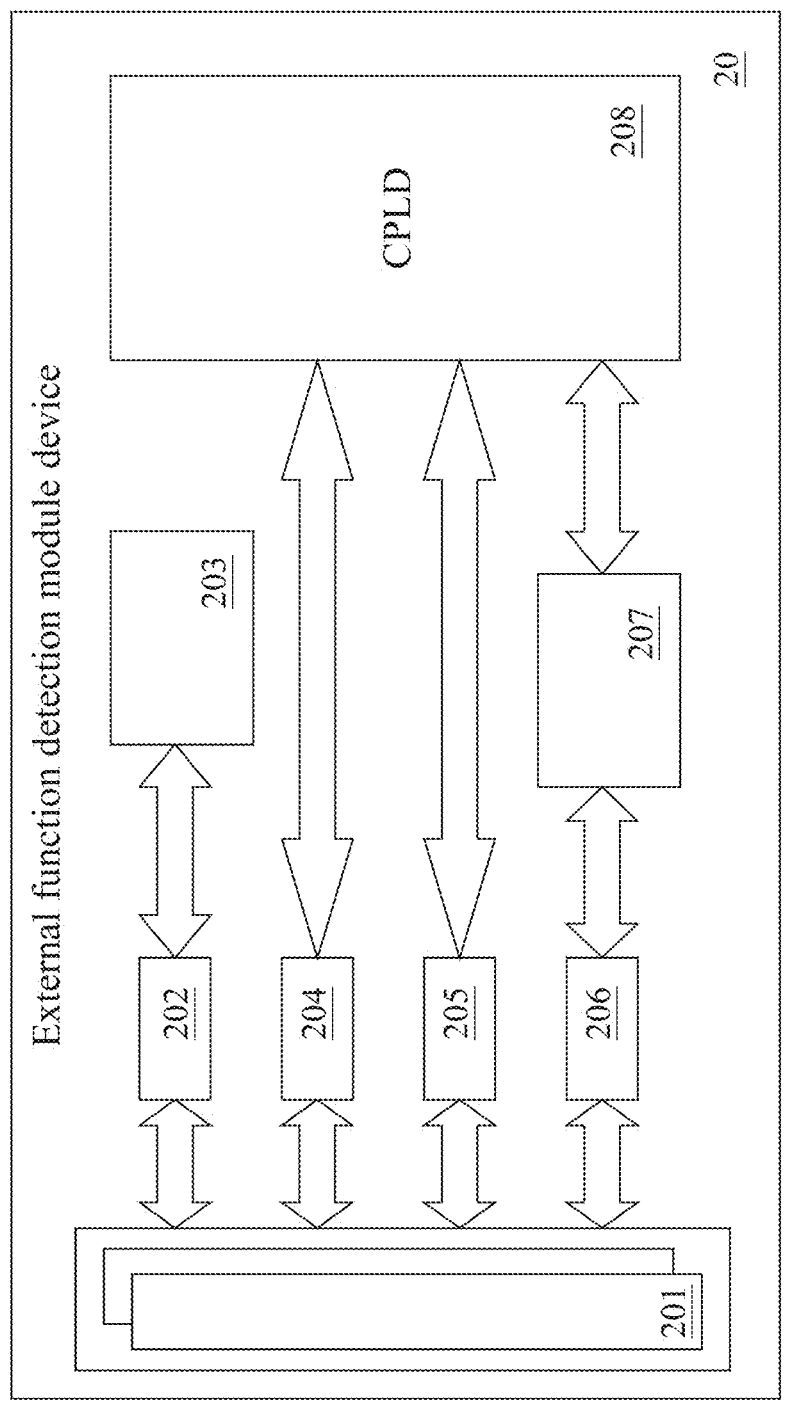
FIG. 2 is a block diagram of an external function detection module device of a self-functional detection system, according to the present invention.

A self-functional detection system of the present invention will be illustrated in the following paragraphs. Please refer to FIG. 1 and FIG. 2. FIG. 1 is a block diagram of a TAP controller of a self-functional detection system, according to the present invention. FIG. 2 is a block diagram of an external function detection module device of a self-functional detection system, according to the present invention.

As shown in FIG. 1 and FIG. 2, the self-functional detection system includes a TAP controller 10, an external function detection module device 20 and a data device 30; the TAP controller 10 includes an uplink circuit 101, a data transmission hub circuit 102, a TAP power module 103, a protocol conversion and data buffer circuit 104, a power output circuit 105, a TAP data bus circuit 106, a TAP IO buffer circuit 107, a TAP JTAG (Joint Test Action Group) driver circuit 108, a discontinuous conduction mode circuit 109 and at least one communication port 110. The external function detection module device 20 includes an at least one external communication port 201, a switch circuit 202, an external power supply module 203, an external data bus circuit 204, an ADC and IO buffer circuit 205, a JTAG signal circuit 206, a level shift circuit 207 and a complex programmable logic device 208.

A data transmission hub circuit 102 of the TAP controller 10 is electrically connected to an uplink circuit 101 of the TAP controller 10. The TAP power module 103 of the TAP controller 10 is electrically connected to an uplink circuit 101 of the TAP controller 10. The protocol conversion and data buffer circuit 104 of the TAP controller 10 is electrically connected to the data transmission hub circuit 102 of the TAP controller 10. The power output circuit 105 of the TAP controller 10 is electrically connected to the protocol conversion and data buffer circuit 104 of the TAP controller 10. The TAP data bus circuit 106 of the TAP controller 10 is electrically connected to the protocol conversion and data buffer circuit 104 of the TAP controller 10. The TAP IO buffer circuit 107 of the TAP controller 10 is electrically connected to the protocol conversion and data buffer circuit 104 of the TAP controller 10. The TAP JTAG driver circuit 108 of the TAP controller 10 is electrically connected to the protocol conversion and data buffer circuit 104 of the TAP controller 10. The DCM circuit 109 of the TAP controller 10 is electrically connected to the data transmission hub circuit 102 of the TAP controller 10, the power output circuit 105 of the TAP controller 10, the data bus circuit 106 of the TAP controller 10, the IO buffer circuit 107 of the TAP controller 10, and the JTAG driver circuit 108 of the TAP controller 10. The at least one communication port 110 of the TAP controller 10 is electrically connected to the power output circuit 105 of the TAP controller 10, the data bus circuit 106 of the TAP controller 10, the IO buffer circuit 107 of the TAP controller 10, and the JTAG driver circuit 108 of the TAP controller 10.

In a first embodiment for self-functional detection of the TAP controller 10, the DCM circuit 109 of the TAP controller 10 obtains a voltage signal, a GPIO signal and a high-speed signal from the power output circuit 105 of the TAP controller 10, the data bus circuit 106 of the TAP controller 10, the IO buffer circuit 107 of the TAP controller 10, and the JTAG driver circuit 108 of the TAP controller 10, to implement detection for internal circuits of the TAP controller 10.

The data device 30 is electrically connected to the TAP controller 10, the data device 30 obtains the voltage signal, the GPIO signal and the high-speed signal from the DCM circuit 109 of the TAP controller 10 through an application programming interface (API), and displays the voltage signal, the GPIO signal and the high-speed signal. The data device 30 displays the voltage signal, the GPIO signal and the high-speed signal, through a time waveform chart. However, these examples are merely for exemplary illustration, and the application field of the present invention is not limited to these examples.

Figure 3:
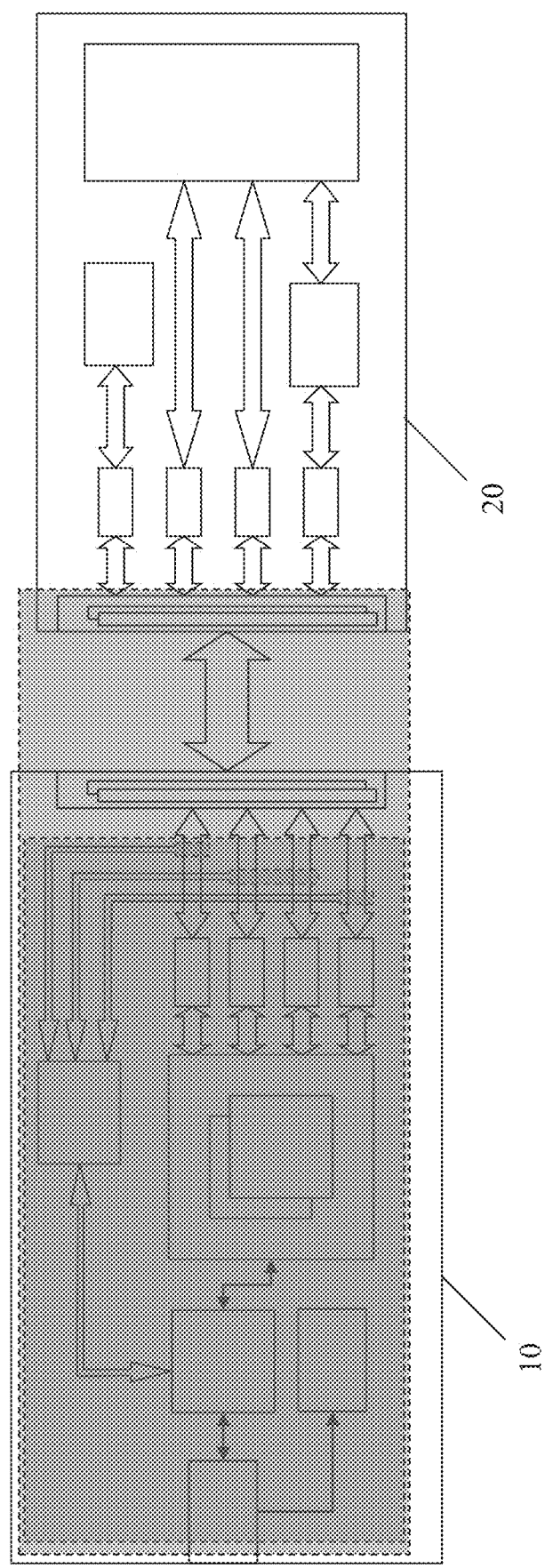
FIG. 3 is a block diagram of an entire testing operation of a self-functional detection system, according to the present invention.
Figure 4B:
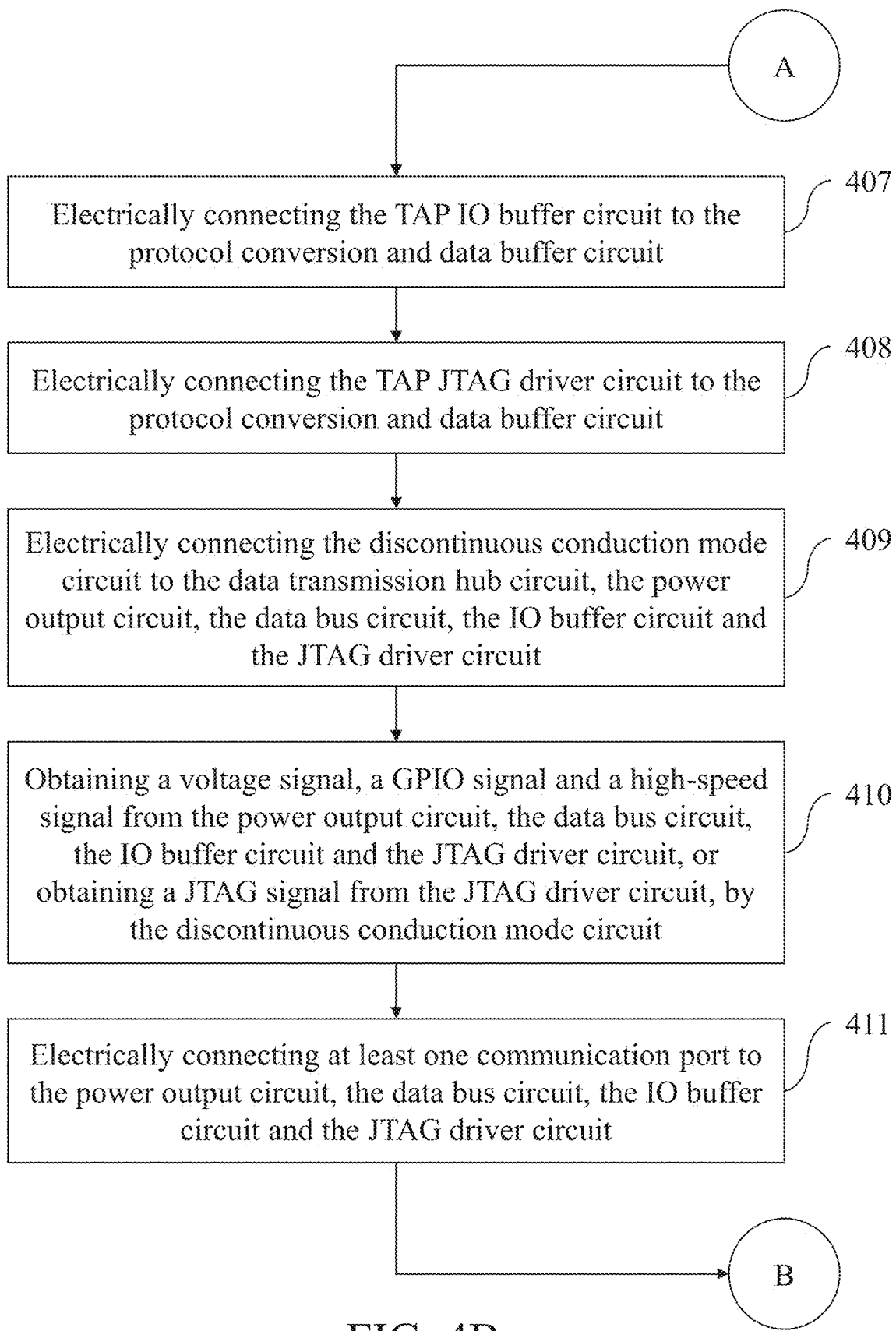
Figure 4C:
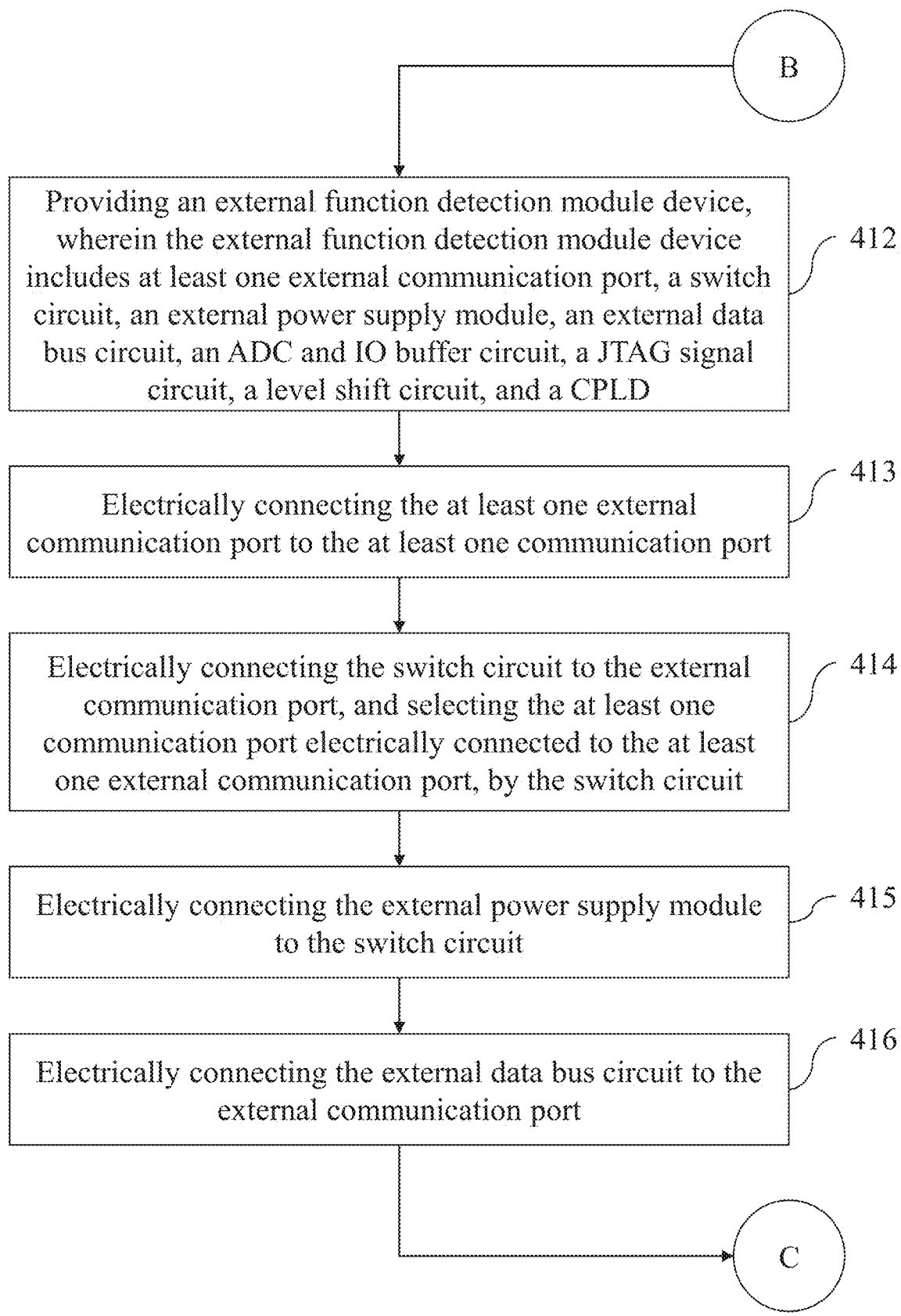
Figure 4D:
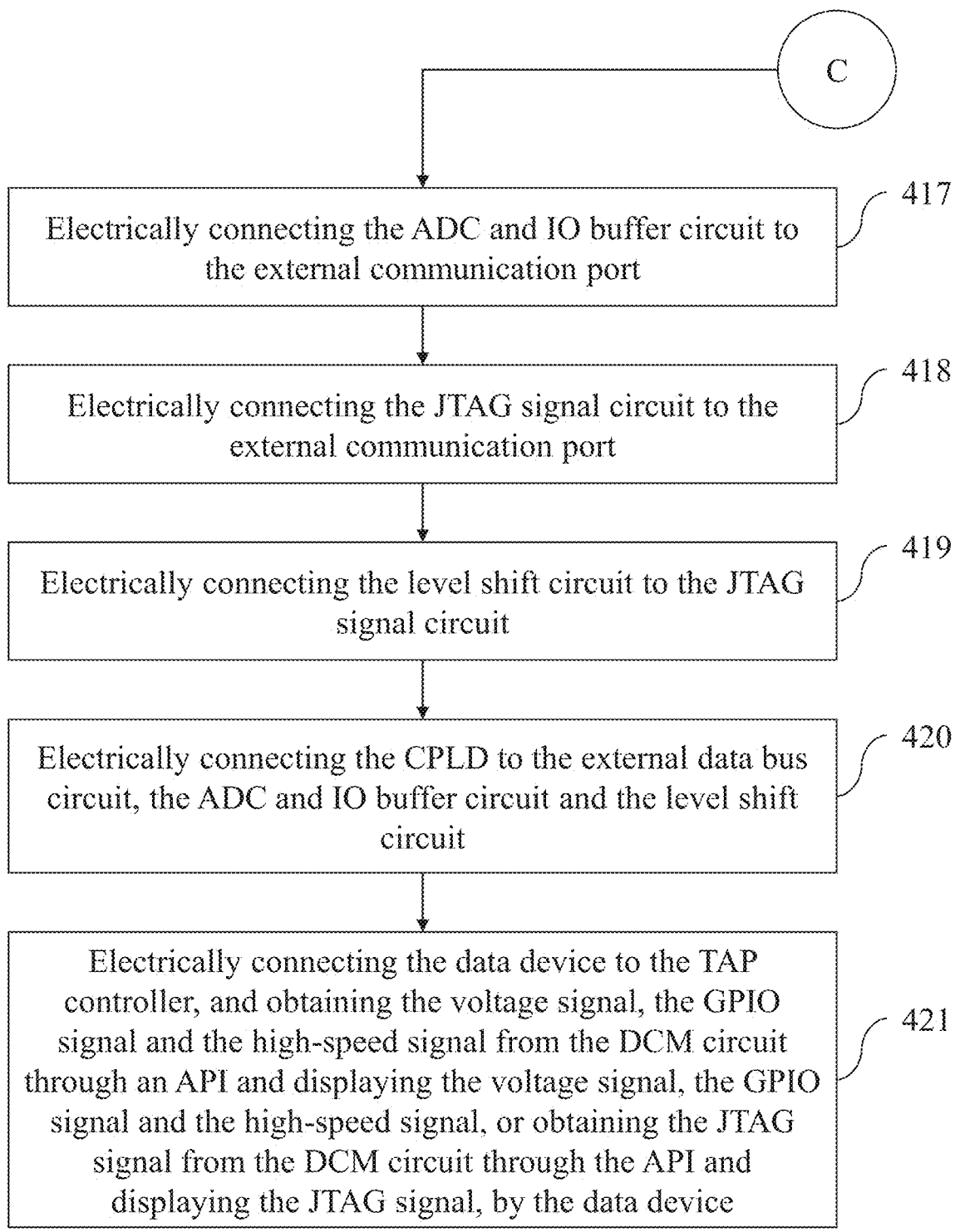

A second embodiment for self-functional detection of the TAP controller 10 will be illustrated in the following paragraphs. Please refer to FIG. 1 to FIG. 3. FIG. 3 is a block diagram of an entire testing operation of a self-functional detection system, according to the present invention. The TAP controller 10 is electrically connected to the external function detection module device 20 through the at least one communication port 110 and the at least one external communication port 201. A switch circuit 202 of the external function detection module device 20 is electrically connected to at least one external communication port 201 of the external function detection module device 20, to select the at least one external communication port 201 electrically connected to the at least one communication port 101. An external power supply module 203 of the external function detection module device 20 is electrically connected to the switch circuit 202 of the external function detection module device 20. An external data bus circuit 204 of the external function detection module device 20 is electrically connected to the at least one external communication port 201 of the external function detection module device 20. An ADC and IO buffer circuit 205 of the external function detection module device 20 is electrically connected to the at least one external communication port 201 of the external function detection module device 20. A JTAG signal circuit 206 of the external function detection module device 20 is electrically connected to at least one external communication port 201 of the external function detection module device 20. A level shift circuit 207 of the external function detection module device 20 is electrically connected to the JTAG signal circuit 206 of the external function detection module device 20. A CPLD 208 of the external function detection module device 20 is electrically connected to the external data bus circuit 204 of the external function detection module device 20, the ADC and IO buffer circuit 205 of the external function detection module device 20, the level shift circuit 207 of the external function detection module device 20.

the TAP controller 10 is electrically connected to the external function detection module device 20 through the at least one communication port 110 and the at least one external communication port 201. The second embodiment for self-functional detection of the TAP controller 10 includes detecting for whether the at least one communication port 110 of the TAP controller 10 works normally, and further detecting whether the external connection of the TAP controller 10 works normally. The data device 30 is electrically connected to the TAP controller 10, the data device 30 obtains the JTAG signal from the DCM circuit 109 of the TAP controller 10 through the application programming interface and displays the JTAG signal. The data device 30 displays the JTAG signal through a time waveform chart. However, these examples are merely for exemplary illustration, and the application field of the present invention is not limited to these examples. The JTAG signal can include a TDI signal, a TDO signal, a TCK signal and a TMS signal.

The operation method of the present invention will be illustrated in the following paragraphs. Please refer to FIG. 4A to FIG. 4D. FIG. 4A to FIG. 4D are flowcharts of a self-functional detection method, according to the present invention.

The self-functional detection method for TAP controller includes the following steps.

In a step 401, a TAP controller is provided, and the TAP controller comprises an uplink circuit, a data transmission hub circuit, a TAP power module, a protocol conversion and data buffer circuit, a power output circuit, a TAP data bus circuit, a TAP IO buffer circuit, a TAP JTAG driver circuit, a discontinuous conduction mode circuit and the at least one communication port. In a step 402, the data transmission hub circuit is electrically connected to the uplink circuit. In a step 403, the TAP power module is electrically connected to the uplink circuit. In a step 404, the protocol conversion and data buffer circuit is electrically connected to the data transmission hub circuit. In a step 405, the power output circuit is electrically connected to the protocol conversion and data buffer circuit. In a step 406, the TAP data bus circuit is electrically connected to the protocol conversion and data buffer circuit. In a step 407, the TAP IO buffer circuit is electrically connected to the protocol conversion and data buffer circuit. In a step 408, the TAP JTAG driver circuit is electrically connected to the protocol conversion and data buffer circuit. In a step 409, the discontinuous conduction mode circuit is electrically connected to the data transmission hub circuit, the power output circuit, the data bus circuit, the IO buffer circuit and the JTAG driver circuit. In a step 410, the discontinuous conduction mode circuit obtains a voltage signal, a GPIO signal and a high-speed signal from the power output circuit, the data bus circuit, the IO buffer circuit and the JTAG driver circuit, or obtaining a JTAG signal from the JTAG driver circuit. In a step 411, at least one communication port is electrically connected to the power output circuit, the data bus circuit, the IO buffer circuit and the JTAG driver circuit. In a step 412, an external function detection module device is provided, and the external function detection module device includes at least one external communication port, a switch circuit, an external power supply module, an external data bus circuit, an ADC and IO buffer circuit, a JTAG signal circuit, a level shift circuit, and a complex programmable logic device (CPLD). In a step 413, the at least one external communication port is electrically connected to the at least one communication port. In a step 414, the switch circuit is electrically connected to the external communication port and configured to select the at least one communication port electrically connected to the at least one external communication port. In a step 415, the external power supply module is electrically connected to the switch circuit. In a step 416, the external data bus circuit is electrically connected to the external communication port. In a step 417, the ADC and IO buffer circuit is electrically connected to the external communication port. In a step 418, the JTAG signal circuit is electrically connected to the external communication port. In a step 419, the level shift circuit is electrically connected to the JTAG signal circuit. In a step 420, the CPLD is electrically connected to the external data bus circuit, the ADC and IO buffer circuit and the level shift circuit. In a step 421, the data device is electrically connected to the TAP controller, and the data device obtains the voltage signal, the GPIO signal and the high-speed signal from the DCM circuit through an API and displaying the voltage signal, the GPIO signal and the high-speed signal, or obtaining the JTAG signal from the DCM circuit through the API and displaying the JTAG signal.

According to above-mentioned contents, the TAP controller includes the DCM circuit, and the data device can obtain and display the voltage signal, the GPIO signal and the high-speed signal from the DCM circuit through the API, to implement detection for the internal circuit of the TAP controller; alternatively, the TAP controller can be electrically connected to the external function detection module device, the data device obtains the JTAG signal from the DCM circuit through the API and displays the JTAG signal, so as to detect whether the communication port function of the TAP controller works normally, and further detect whether an external connection of the TAP controller works normally.

Therefore, the above-mentioned solution of the present is able to solve the problem that integrating the TAP controller into the JTAG testing system make it challenging to accurately determine the problem area where the testing error occurred in JTAG testing, so as to achieve the technical effect of providing self-functional detection of a TAP controller to determine occur point of test error accurately.

The present invention disclosed herein has been described by means of specific embodiments. However, numerous modifications, variations and enhancements can be made thereto by those skilled in the art without departing from the spirit and scope of the disclosure set forth in the claims.

What is claimed is:

1. A self-functional detection system for TAP controller, comprising
    a TAP controller, comprising:
        an uplink circuit;
        a data transmission hub circuit, electrically connected to the uplink circuit;
        a TAP power module, electrically connected to the uplink circuit;
        a protocol conversion and data buffer circuit, electrically connected to the data transmission hub circuit;
        a power output circuit, electrically connected to the protocol conversion and data buffer circuit;
        a TAP data bus circuit, electrically connected to the protocol conversion and data buffer circuit;
        a TAP IO buffer circuit, electrically connected to the protocol conversion and data buffer circuit;
        a TAP JTAG driver circuit, electrically connected to the protocol conversion and data buffer circuit;
        a discontinuous conduction mode circuit, electrically connected to the data transmission hub circuit, the power output circuit, the data bus circuit, the IO buffer circuit and the JTAG driver circuit, and configured to obtain a voltage signal, a GPIO signal and a high-speed (HS) signal from the power output circuit, the data bus circuit, the IO buffer circuit and the JTAG driver circuit, or obtain a JTAG signal from the JTAG driver circuit; and
        at least one communication port, electrically connected to the power output circuit, the data bus circuit, the IO buffer circuit and the JTAG driver circuit;
    an external function detection module device, comprising:
        at least one external communication port, electrically connected to one of the at least one communication port;
        a switch circuit, electrically connected to the external communication port, configured to select the at least one communication port electrically connected to the at least one external communication port;
        an external power supply module, electrically connected to the switch circuit;
        an external data bus circuit, electrically connected to the external communication port;
        an ADC and IO buffer circuit, electrically connected to the external communication port;
        a JTAG signal circuit, electrically connected to the external communication port;
        a level shift circuit, electrically connected to the JTAG signal circuit; and
        a complex programmable logic device (CPLD), electrically connected to the external data bus circuit, the ADC and IO buffer circuit and the level shift circuit; and
    a data device, electrically connected to the TAP controller, and configured to obtain the voltage signal, the GPIO signal and the high-speed signal from the DCM circuit through an application programming interface (API) and display the voltage signal, the GPIO signal and the high-speed signal, or obtain the JTAG signal from the DCM circuit and display the JTAG signal, through the API.

2. The self-functional detection system for TAP controller according to claim 1, wherein the data device displays the voltage signal, the GPIO signal and the high-speed signal through a time waveform chart.

3. The self-functional detection system for TAP controller according to claim 1, wherein the data device displays the JTAG signal through a time waveform chart.

4. The self-functional detection system for TAP controller according to claim 3, wherein the JTAG signal comprises a test data input (TDI) signal, a test data output (TDO) signal, a test clock (TCK) signal and a test mode select (TMS) signal.

5. A self-functional detection method for TAP controller, comprising:
- providing a TAP controller, wherein the TAP controller comprises an uplink circuit, a data transmission hub circuit, a TAP power module, a protocol conversion and data buffer circuit, a power output circuit, a TAP data bus circuit, a TAP IO buffer circuit, a TAP JTAG driver circuit, a discontinuous conduction mode circuit and the at least one communication port;
- electrically connecting the data transmission hub circuit to the uplink circuit;
- electrically connecting the TAP power module to the uplink circuit;
- electrically connecting the protocol conversion and data buffer circuit to the data transmission hub circuit;
- electrically connecting the power output circuit to the protocol conversion and data buffer circuit;
- electrically connecting the TAP data bus circuit to the protocol conversion and data buffer circuit;
- electrically connecting the TAP IO buffer circuit to the protocol conversion and data buffer circuit;
- electrically connecting the TAP JTAG driver circuit to the protocol conversion and data buffer circuit;
- electrically connecting the discontinuous conduction mode circuit to the data transmission hub circuit, the power output circuit, the data bus circuit, the IO buffer circuit and the JTAG driver circuit;
- obtaining a voltage signal, a GPIO signal and a high-speed signal from the power output circuit, the data bus circuit, the IO buffer circuit and the JTAG driver circuit, or obtaining a JTAG signal from the JTAG driver circuit, by the discontinuous conduction mode circuit;
- electrically connecting at least one communication port to the power output circuit, the data bus circuit, the IO buffer circuit and the JTAG driver circuit;
- providing an external function detection module device, wherein the external function detection module device includes at least one external communication port, a switch circuit, an external power supply module, an external data bus circuit, an ADC and IO buffer circuit, a JTAG signal circuit, a level shift circuit, and a complex programmable logic device;
- electrically connecting the at least one external communication port to the at least one communication port;
- electrically connecting the switch circuit to the external communication port, and selecting the at least one communication port electrically connected to the at least one external communication port, by the switch circuit;
- electrically connecting the external power supply module to the switch circuit;
- electrically connecting the external data bus circuit to the external communication port;
- electrically connecting the ADC and IO buffer circuit to the external communication port;
- electrically connecting the JTAG signal circuit to the external communication port;
- electrically connecting the level shift circuit to the JTAG signal circuit;
- electrically connecting the CPLD to the external data bus circuit, the ADC and IO buffer circuit and the level shift circuit; and
- electrically connecting the data device to the TAP controller, and obtaining the voltage signal, the GPIO signal and the high-speed signal from the DCM circuit through an API and displaying the voltage signal, the GPIO signal and the high-speed signal, or obtaining the JTAG signal from the DCM circuit through the API and displaying the JTAG signal, by the data device.

6. The self-functional detection method for TAP controller according to claim 5, wherein the data device displays the voltage signal, the GPIO signal and the high-speed signal through a time waveform chart.

7. The self-functional detection method for TAP controller according to claim 5, wherein the data device displays the JTAG signal through a time waveform chart.

8. The self-functional detection method for TAP controller according to claim 7, wherein the JTAG signal comprises a TDI signal, a TDO signal, a TCK signal and a TMS signal.

* * * * *